(12) United States Patent
Hsu et al.

(10) Patent No.: US 9,466,727 B1
(45) Date of Patent: Oct. 11, 2016

(54) SEMICONDUCTOR DEVICE AND METHOD OF FABRICATING THE SAME

(71) Applicant: UNITED MICROELECTRONICS CORP., Hsin-Chu (TW)

(72) Inventors: Chia-Fu Hsu, Tainan (TW); Chun-Yuan Wu, Yun-Lin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/925,984

(22) Filed: Oct. 29, 2015

(51) Int. Cl.
| | |
|---|---|
| H01L 21/44 | (2006.01) |
| H01L 29/786 | (2006.01) |
| H01L 29/66 | (2006.01) |
| H01L 21/768 | (2006.01) |
| H01L 23/535 | (2006.01) |
| H01L 23/532 | (2006.01) |

(52) U.S. Cl.
CPC ..... *H01L 29/7869* (2013.01); *H01L 21/76805* (2013.01); *H01L 21/76831* (2013.01); *H01L 21/76895* (2013.01); *H01L 23/535* (2013.01); *H01L 23/5329* (2013.01); *H01L 29/66969* (2013.01); *H01L 29/78648* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 8,236,702 B2 | 8/2012 | Chang et al. | |
| 2010/0327377 A1 | 12/2010 | Dewey et al. | |
| 2011/0109856 A1* | 5/2011 | Huang | G02F 1/1362 349/129 |
| 2013/0329167 A1* | 12/2013 | Iwanami | G02F 1/1334 349/86 |

* cited by examiner

*Primary Examiner* — Alexander Ghyka
(74) *Attorney, Agent, or Firm* — Winston Hsu; Scott Margo (57) ABSTRACT

A semiconductor device and a method of forming the same, the semiconductor device includes a substrate, a metal-oxide-semiconductor (MOS) transistor, a plug, a hydrogen blocking layer and an oxide semiconductor (OS) structure. The MOS transistor is disposed on the substrate, and the plug is disposed on the MOS transistor to electrically connect thereto. The hydrogen blocking layer is disposed only on sidewalls of the plug, wherein the hydrogen blocking layer includes a high-k dielectric layer. The OS structure is disposed on the substrate, wherein the OS structure includes an oxide semiconductor layer.

18 Claims, 9 Drawing Sheets

SEMICONDUCTOR DEVICE AND METHOD OF FABRICATING THE SAME

BACKGROUND OF THE INVENTION

1. Field of the Invention

The present invention relates to a semiconductor device and a method for forming the same, and more particularly, to a semiconductor device having an oxide semiconductor (OS) structure and a method for forming the same.

2. Description of the Prior Art

In modern society, micro-processor systems comprising integrated circuits (IC) are ubiquitous devices, being utilized in diverse fields such as automatic control electronics, mobile communication devices and personal computers. With the development of technology and the increase of original applications for electronic products, the IC devices are becoming smaller, more delicate and more diversified.

In a wide variety of materials, indium oxide ($In_2O_3$), tin oxide ($SnO_2$) and zinc oxide (ZnO) are generally known transparent conductive oxides. Indium tin oxide (ITO), when being formed of a thin film, can be used as a transparent electrode in a flat panel display or a touch sensor of a capacitance type touch panel. Tin oxide and zinc oxide can be used in a transparent solar cell electrode. However, these materials are essentially semiconductor materials, and it is desired for researchers to develop a semiconductor device by using their semiconductor material properties, such as an oxide semiconductor transistor.

However, due to oxidation of the semiconductor material itself, when using this oxide semiconductor material, it is easy to damage the oxide semiconductor layer during the production process, thus affecting the performance of the product. Therefore, for a semiconductor device having an oxide semiconductor material, there is still a need for a better design or a manufacturing method, thereto gain better quality.

SUMMARY OF THE INVENTION

The present invention therefore provides a semiconductor device having an oxide semiconductor (OS) structure and a method of forming the same, in order to gain better product performance.

To achieve the purpose described above, the present invention provides a semiconductor device including a substrate, a metal-oxide-semiconductor (MOS) transistor, a plug, a hydrogen blocking layer and an oxide semiconductor (OS) structure. The MOS transistor is disposed on the substrate, and the plug is disposed on the MOS transistor to electrically connect thereto. The hydrogen blocking layer is disposed only on sidewalls of the plug, wherein the hydrogen blocking layer comprises hafnium oxide ($HfO_x$), hafnium silicon oxide ($HfSiO_4$), hafnium silicon oxynitride (HfSiON), aluminum oxide ($Al_2O_3$), lanthanum oxide ($La_2O_3$) or hafnium zirconium oxide (HfZrO). The OS structure is disposed on the substrate, wherein the OS structure comprises an oxide semiconductor layer.

To achieve the purpose described above, the present invention provides a method of forming a semiconductor device including following steps. First of all, a substrate is provided. Then, a metal-oxide-semiconductor (MOS) transistor is formed on the substrate. Next, a plug is formed on the MOS transistor to electrically connect thereto. Next, a hydrogen blocking layer is disposed only on sidewalls of the plug, wherein the hydrogen blocking layer comprises hafnium oxide (HfOx), hafnium silicon oxide ($HfSiO_4$), haf- nium silicon oxynitride (HfSiON), aluminum oxide ($Al_2O_3$), lanthanum oxide ($La_2O_3$) or hafnium zirconium oxide (HfZrO). Finally, an oxide semiconductor (OS) structure is formed on the substrate, wherein the OS structure comprises an oxide semiconductor layer.

According to the above, the semiconductor device and the forming method thereof in the present invention include disposing the hydrogen blocking layers (including hafnium oxide, hafnium silicon oxide, hafnium silicon oxynitride, aluminum oxide, lanthanum oxide or hafnium zirconium oxide) on the sidewalls of the plugs either below or over an oxide semiconductor (OS) structure. Thus, the hydrogen blocking layer is sufficient to prevent out-diffusion mist and hydrogen in the device, so as to avoid such out-diffusion mist and hydrogen diffusing along the plug and affecting the OS structure or the subsequent forming processes.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Please refer to FIG. 1 to FIG. 10, showing schematic diagrams of the method of forming a semiconductor structure according to the first embodiment of the present invention. Firstly, a substrate 300 is provided, which may be any component that can serve as a base for forming devices, like a semiconductor substrate for example, such as silicon substrate, epitaxial silicon substrate, or silicon on insulator (SOI), but is not limited thereto. Also, a first region 100 and a second region 200 are defined on the substrate 300.

Figure 1:
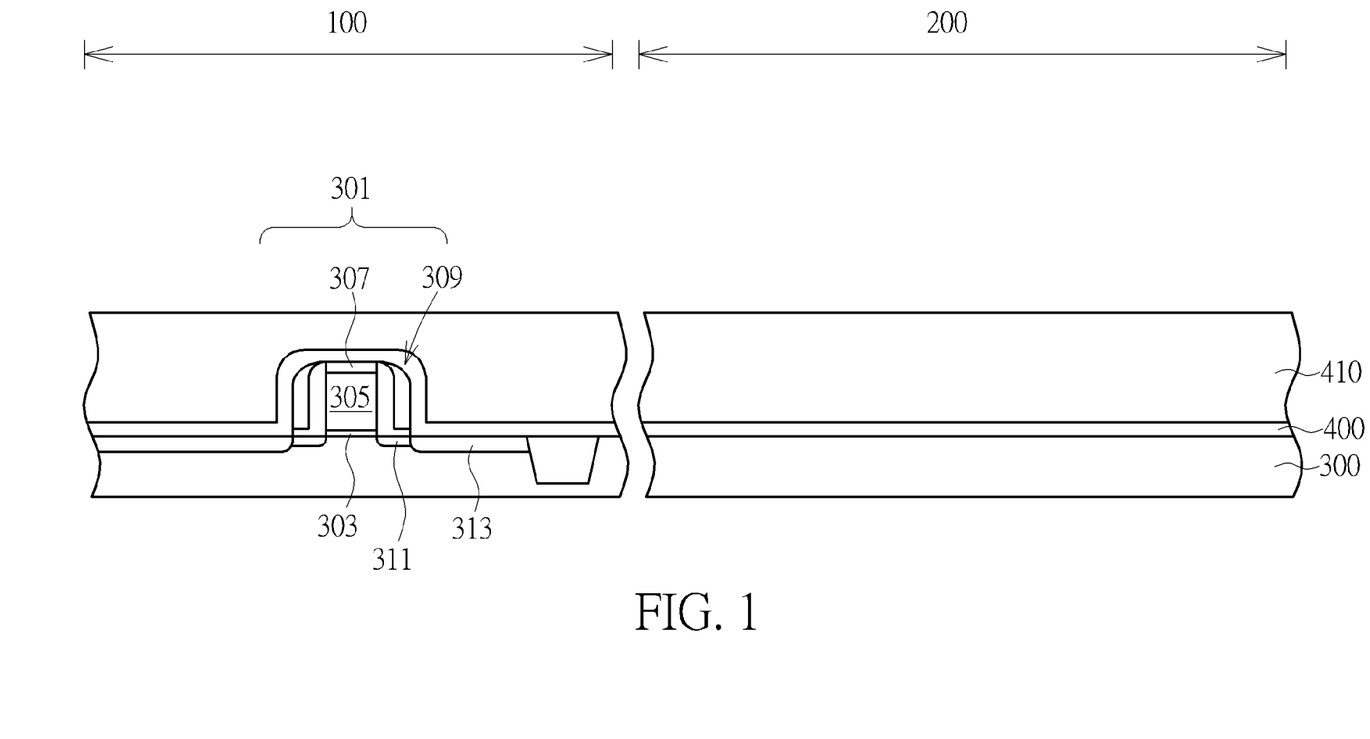
FIG. 1 to FIG. 10 are schematic diagrams illustrating a method of forming a semiconductor device according to a first embodiment of the present invention.

At least one transistor 301 is formed on the substrate 300, and a contact etch stop layer (CESL) 400 and an interlayer dielectric (ILD) layer 410 is formed on the substrate 300, to cover the transistor 301 and the substrate 300. Precisely, the transistor 301 is formed in the first region 100 of the substrate 300, and includes a gate dielectric layer 303, a gate electrode 305, a capping layer 307, a spacer 309, two light doped drain regions 311 and two source/drain regions 313. In one embodiment, the gate dielectric layer 303 may include silicon oxide or high constant dielectric material (greater than 4). The gate electrode 305 may include polysilicon or metal, but is not limited thereto. The capping layer 307 may include silicon nitride (SiN). The spacer 309 can be a monolayer structure or a multilayer structure optionally, for example including high temperature oxide (HTO), SiN, silicon oxide or SiN formed by hexachlorodisilane ($Si_2Cl_6$) (HCD-SiN), as shown in FIG. 1.

In the present embodiment, the transistor 301 may include any active component, like complementary metal oxide semiconductor (CMOS) or photo-diode for example, and the forming method may include following steps. First of all, a gate dielectric material layer (not shown in the drawings), a gate material layer (not shown in the drawings) and a capping material layer (not shown in the drawings) are sequentially stacked on the substrate 300, and then the stacked layers are patterned to form the capping layer 309, the gate electrode 305 and the gate dielectric layer 303. Then, the light doped drain regions 311 is formed at two sides of the gate electrode 305, the spacer 309 is formed to surround the gate electrode 305, and the source/drain regions 313 is formed at two sides of the gate electrode 305 and the spacer 309. However, people skilled in the art shall easily realize that the formation of the transistor 301 may also include other process, or well known by one skilled in the art. For example, in one embodiment of the present invention, after the transistor 301 shown in FIG. 1 is formed, a selective epitaxial growth (SEG) process and/or replacement metal gate (RMG) process is optionally performed, and the detailed steps thereof may be similar to generally process of forming transistor and will not be redundantly described herein.

Figure 2:
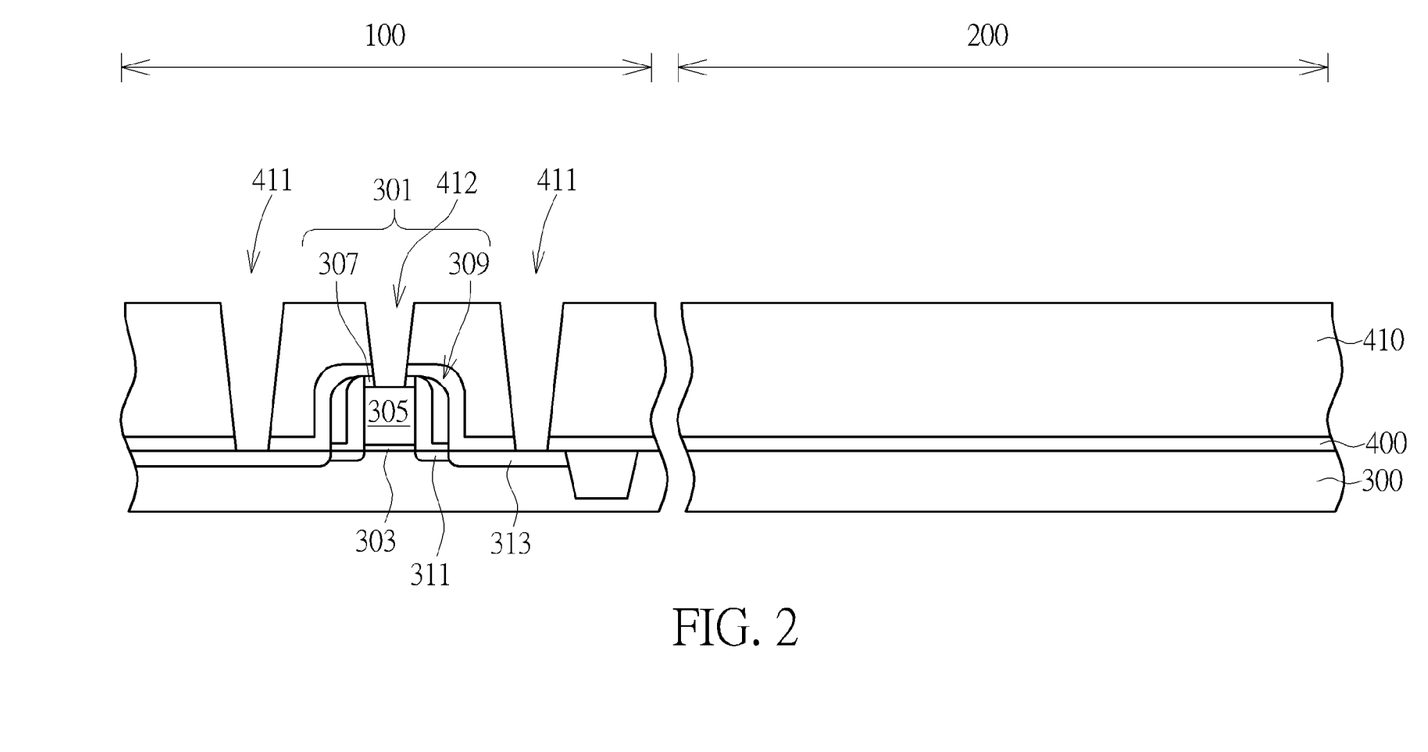

Next, a contact opening etching process is carried out. Precisely, an interlayer dielectric (ILD) layer 410, for example including a low dielectric constant material, is formed on the substrate 300, covering the transistor 301. Then, one or more contact openings 411, 412 are formed in the ILD layer 410 to expose the source/drain regions 313 and the gate electrode 305 respectively underneath. The contact opening etching process may be performed through a single or multiple photolithographic etching process, for example including firstly forming a patterned photoresist layer (not shown in the drawings) on the ILD 410, and performing an etching process by simultaneously using the patterned photoresist layer as a mask, to remove a portion of the ILD 410, thereby forming the contact openings 411, 412 to expose the source/drain regions 313 and the gate electrode 305 respectively, as shown in FIG. 2.

Figure 3:
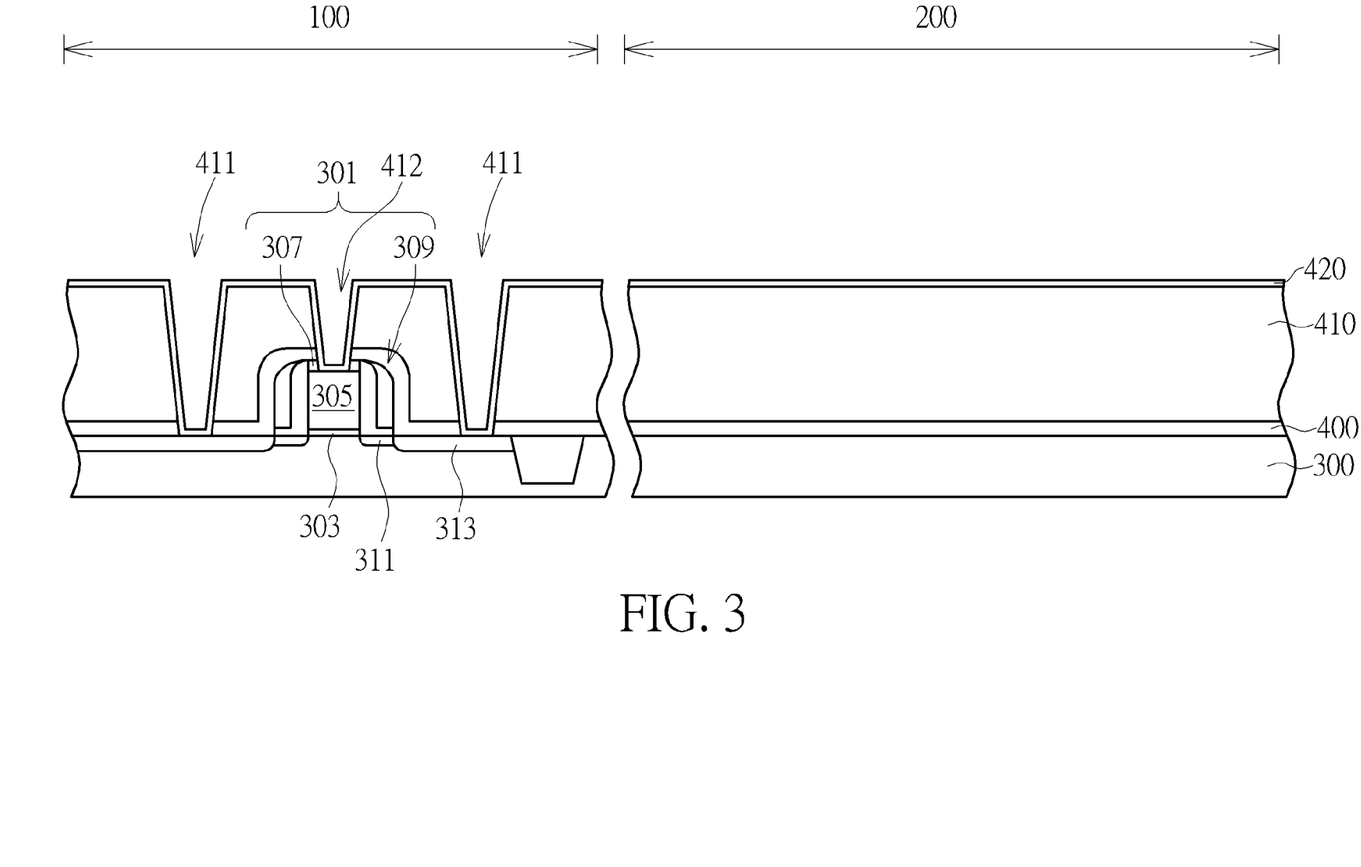

Thereafter, a material layer 420 is formed on the substrate 300, to entirely cover top surfaces of the ILD layer 420, and sidewalls and bottom walls of the contact opening 411, 412, as shown in FIG. 3. In one embodiment, the material layer 420 may include a monolayer or a multilayer structure, preferably including a high dielectric constant (high-k) material, such as a metal oxide layer, preferably an earth metal oxide layer, like hafnium oxide (HfOx), hafnium silicon oxide (HfSiO$_4$), hafnium silicon oxynitride (HfSiON), aluminum oxide (Al$_2$O$_3$), lanthanum oxide (La$_2$O$_3$) or hafnium zirconium oxide (HfZrO), but is not limited thereto. Please note that, in order to avoid any interference to the subsequent processes or subsequent-formed components, like a plug forming process for example, caused by such material layer 420, the material layer 420 preferably includes a relative small thickness, substantially being between 10 angstroms (Å) to 15 angstroms, but is not limited thereto.

Figure 4:
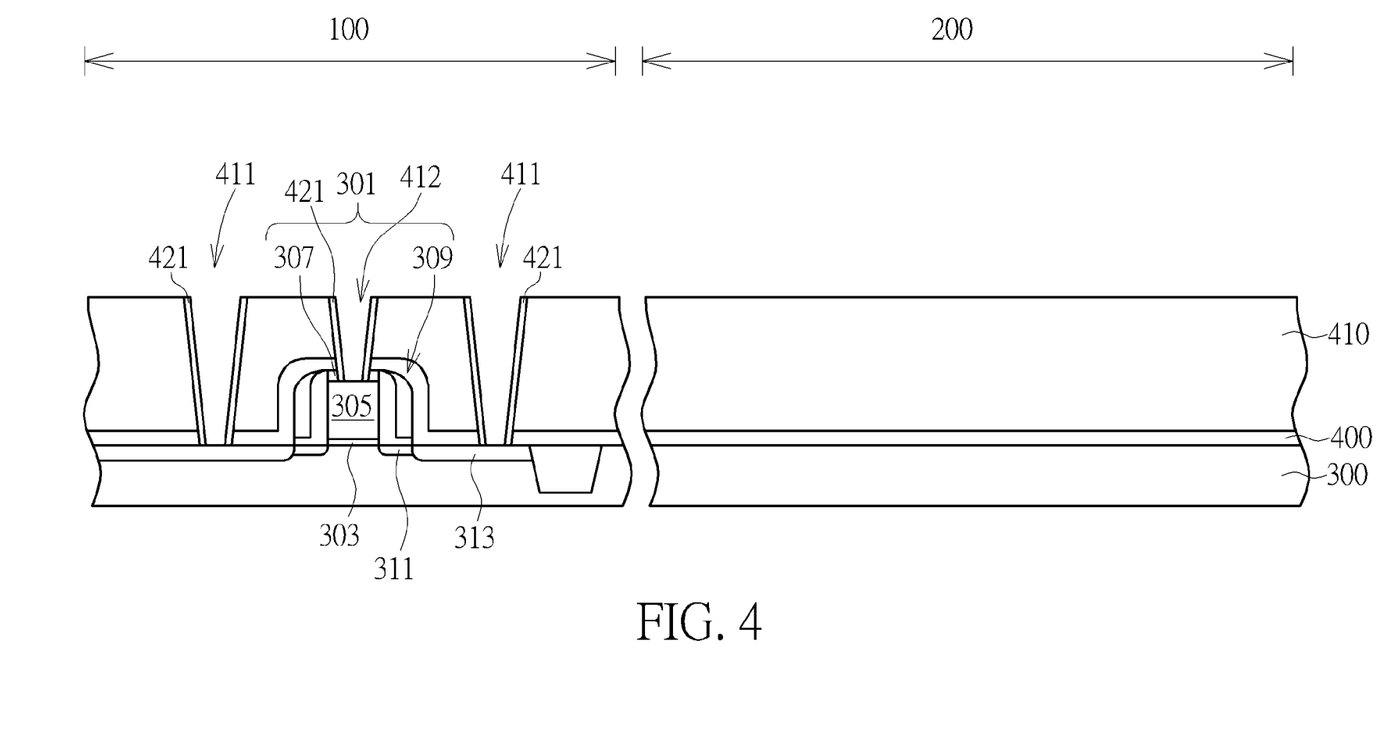

Following these, an etching back process is performed, for example through an anisotropic etching process, such as a dry etching process, or a sequentially performed dry and wet etching process, to remove the material layer 420 on the top surfaces of the ILD layer 410 and on the bottom walls of the contact openings 411, 412, so that, hydrogen blocking layers 421 may be formed only on the sidewalls of the contact openings 411, 412, as shown in FIG. 4.

It is worth noting that, the formation of the hydrogen blocking layers 421 are not limited to being formed through the aforementioned etching back process, and in another embodiment, the hydrogen blocking layers 421 may also be formed by using a washing process. For example, a cleaning process by using argon (Ar) may be performed, to clean surfaces where the contact openings 411, 412 are formed, and to simultaneously remove the material layer 420 on the top surfaces of the ILD layer 410 and on the bottom walls of the contact openings 411, 412. Through such cleaning process, the material layer 420 on the top surfaces of the ILD layer 410 and on the bottom walls of the contact openings 411, 412 may be removed more gently, without further damage to the contact openings 411, 412.

Following these, a silicidation process may be performed in the contact openings 411, to form a silicide layer (not shown in the drawings) on surfaces of the source/drain regions 313 exposed from the contact openings 411. It is worth noting that, the method of forming the silicide layer is not limited to the aforementioned silicidation process, and may include other processes. For example, in one embodiment, the silicidation process may also be performed before the ILD layer 410 and the contact opening 411 are formed, such that, silicide layers (not shown in the drawings) may be uniformly formed on entire surfaces of the source/drain regions 313. In another embodiment, the silicide layer may also be formed through conformally forming a first metal layer (not shown in the drawings), like titanium (Ti) for example, and a second metal layer (not shown in the drawings), like titanium nitride (TiN) for example, in the contact openings 411, 413 after the hydrogen blocking layer 421 is formed, and performing an annealing process to drive the reaction between the first metal layer with the exposed source/drain regions 313 to form a silicide layer (not shown in the drawings), like titanium silicide (TiSi) for example, on the exposed source/drain regions 313. In such embodiment, after the annealing process, the first metal layer (not shown in the drawings) may only remain on the hydrogen blocking layer 421 on the sidewalls of the contact opening 411 to function like a first barrier (not shown in the drawings) in the contact openings 411, and the second metal layer may form a U-shaped second barrier (not shown in the drawings) on the first barrier in the contact opening 411 in the subsequent process. On the other hand, the first metal layer and the second metal layer may both form U-shaped barrier layers (not shown in the drawings) in the contact opening 431 in the subsequent process.

Figure 5:
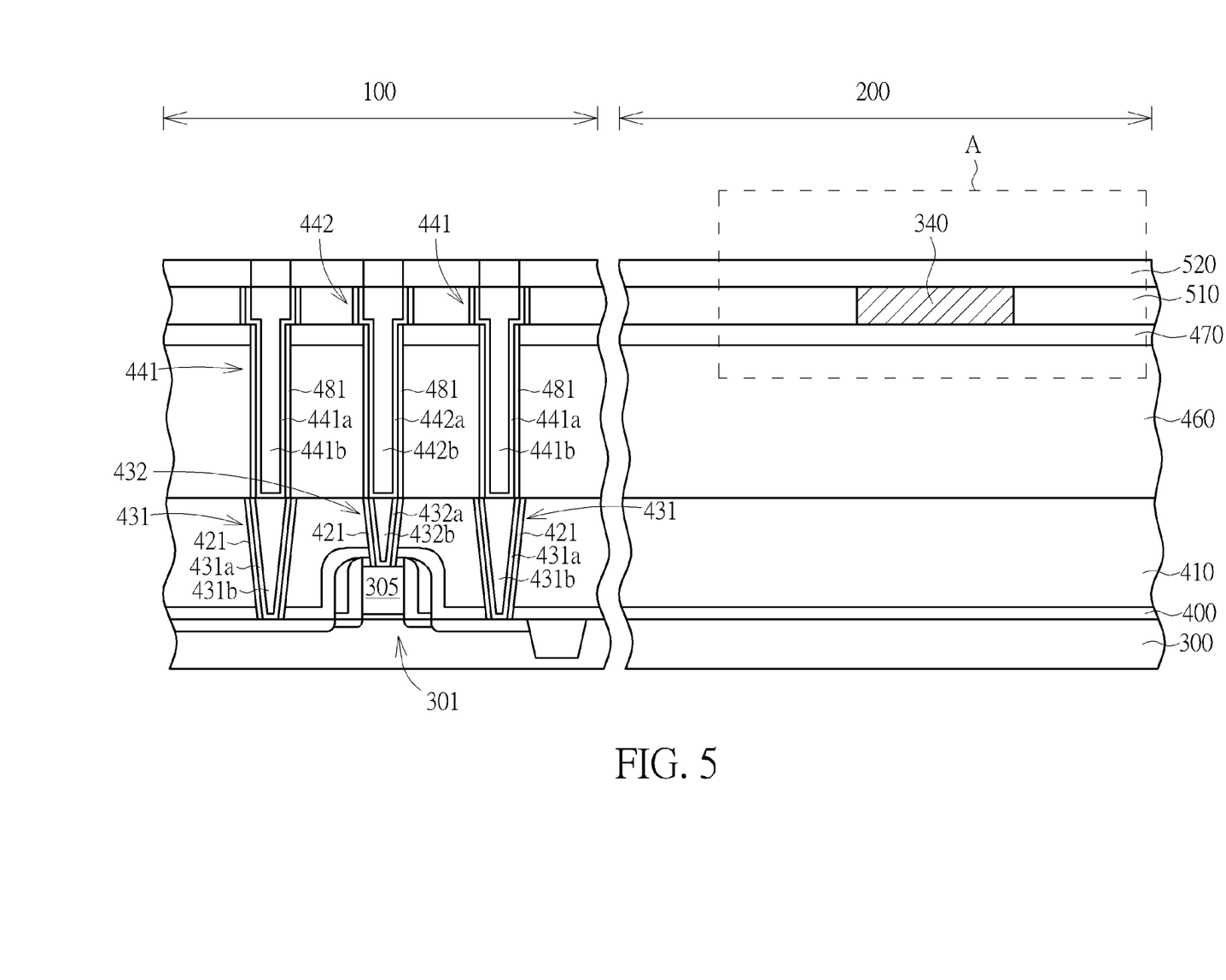

Then, the plug process is performed, to form the plugs 431, 432 electrically connected to the source/drain regions 313 and the gate electrode 305 exposed from the contact openings 411, 412, respectively. The formation of the plugs 431, 432 for example includes firstly forming a barrier material layer (not shown in the drawings) and a metal material layer (not shown in the drawings) in the contact openings 411, 412, and performing a planarization process, like a chemical mechanical polishing (CMP) process, an etching back process or a combination of both for example, to remove a portion of the metal material layer and a portion of the barrier material layer to simultaneously form the plugs 431, 432 thereby. In this manner, the plugs 431, 432 may be level with the top surfaces of the ILD layer 410, and include barrier layers 431a, 432a and contact metal layers 431b, 432b, respectively, as shown in FIG. 5. It is noted that, the plugs 431, 432 both directly contact the hydrogen blocking layers 421, so that, the hydrogen blocking layers 421 may laterally surround the plugs 431, 432. Furthermore, in one embodiment of the present invention, the barrier layers 431a, 432a may include a titanium layer, titanium nitride layer, tantalum layer or tantalum nitride layer; and the contact metal layer 431b, 432b may include tungsten or metal having lower resistance, but not limited thereto.

Subsequently, a metal interconnection system, for example via-first damascene structures 441, 442 may be formed in inter-metal dielectric (IMD) layers 510, 460, to electrically connect the contact plugs 411, 412. Precisely, the damascene structures 441, 442 include barrier layers 441a, 442a and contact metal layers 441b, 442b, respectively, as shown in FIG. 5. In one embodiment, the formation of the damascene structures 441, 442 for example includes firstly defining via openings (not shown in the drawings) in the IMD layer 510 by using a stop layer 470 as a etch stop layer, further defining trenches (not shown in the drawings) in the IMD layer 510 to penetrate through the stop layer 470 and the IMD layer 460, forming hydrogen blocking layers 481 only on sidewalls of the trenches and the via openings, and finally forming the damascene structures 441, 442 in the via openings and the trenches, wherein each of the damascene structures 441, 442 also consists of a plug (not shown in the drawings) and a metal wire (not shown in the drawings).

It is worth noting that, the hydrogen blocking layers 481 include a high-k dielectric material, such as a metal oxide layer, preferably an earth metal oxide layer, like hafnium oxide, hafnium silicon oxide, hafnium silicon oxynitride, aluminum oxide, lanthanum oxide or hafnium zirconium oxide, but is not limited thereto. Also, in order to avoid any interference to the subsequent processes or subsequent-formed components, like a plug forming process for example, caused by such hydrogen blocking layers 481, the hydrogen blocking layers 481 preferably include a relative small thickness, substantially being between 10 angstroms (Å) to 15 angstroms, but is not limited thereto. Please also noted that, the forming process of the hydrogen blocking layers 481 is substantially similar to those of the hydrogen blocking layers 421 or is well known in the art, and will not be redundantly described herein.

Through the aforementioned process, the contact plugs 431, 432 and the damascene structures 441, 442 are sequentially formed in the first region 100 of the substrate 300, to electrically connect the transistor 301, thereby receiving or delivering any input/output signals obtained from the transistor 301.

On the other hand, while the contact plugs 431, 432 and the damascene structures 441, 442 are formed in the first region 100, an oxide semiconductor (OS) structure may be optionally formed in the second region 200. For example, a conductive layer, which includes the same metal material (such as copper) as that of the metal layers 441b, 442b of the damascene structures 441, 441 may be simultaneously formed in the IMD layer 510 or other IMD layers in the second region 200, to function like a back gate electrode 340 of a dual gate structure, as shown in FIG. 5. Then, an insulating layer 520 may be formed on the IMD layer 510, wherein the insulating layer 520 may include a monolayer structure or a multilayer structure and the material thereof may include general low-k dielectric material, like silicon oxide for example, or high-k dielectric material, like metal oxide, preferably an earth metal oxide, like hafnium oxide, but is not limited thereto. Next, please refer FIGS. 6-10. In order to illustrate the present invention conveniently, FIGS. 6-10 illustrate the enlarged region A shown in FIG. 5.

In addition, an oxide semiconductor (OS) material layer 306 and a conductive material layer 310 are formed on the insulating layer 520. The OS material layer 306 may be a single layer or have a multilayered structure, wherein each may contain the same or different materials, e.g., indium gallium zinc oxide (InGaZnO), $InGaO_2$, $InZnO_2$, ZnInO or GaZnO. Preferably, it contains C-axis aligned crystal InGaZn (CAAC-InGaZnO), such that, the OS material layer 306 may exhibit high carrier mobility and low leakage current to serve as a channel layer of the bottom gate electrode 340. It is understood for one skilled in the art that the OS material layer in the present invention may have other material or may have multi-layers, wherein each layer has the same or different material, which is not limited to the above embodiment.

Figure 6:
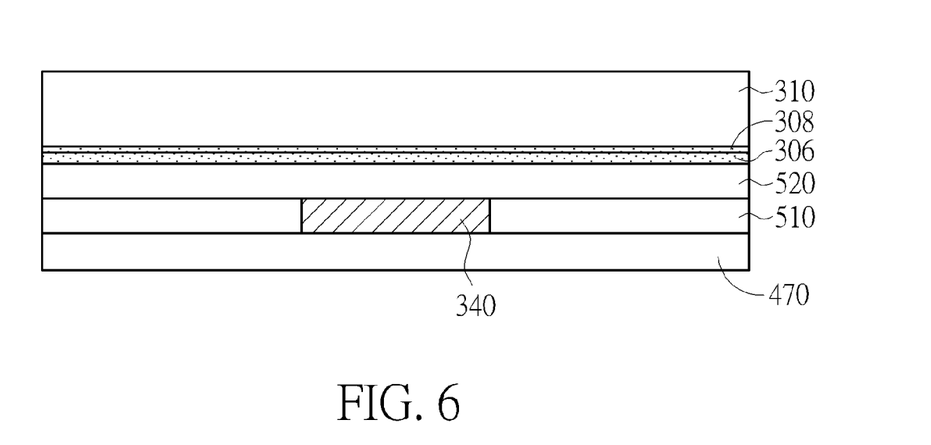

In one embodiment, an insulating layer 308 may further be formed on the OS material layer 306, as shown in FIG. 6. It is worth noting that the insulating layer 308 is preferably composed of an oxide semiconductor (OS) material, such as InGaZnO, $InGaO_2$, $InZnO_2$ or ZnInO or GaZnO, and is not limited thereto. Preferably, the material of the OS material in the insulating layer 308 is different than that of the OS material layer 306, and a thickness of the insulating layer 308 is less than that of the OS material layer 306, but is not limited thereto. By doing this, the insulating layer 308 may serve as a barrier layer.

Figure 7:
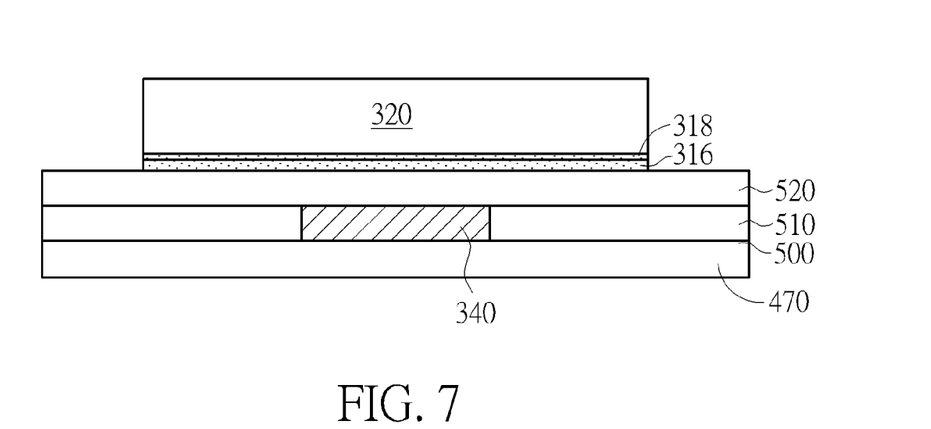

Next, the OS material layer 306 and the conductive material layer 310 are patterned to form an OS layer 316 and a patterned conductive layer 320. The patterning process may be carried out by one single photo-etching-process (PEP) or a plurality of PEPs. In the embodiment of forming the insulating layer 308, the OS material layer 306, the insulating layer 308 and the conductive material layer 310 may be patterned simultaneously, wherein the insulating layer 520 is used as an etch stop layer. Accordingly, the sidewall of the OS layer 316, the sidewall of the patterned insulating layer 318 and the sidewall of the patterned conductive layer 320 are vertically aligned with each other, as shown in FIG. 7. It is noted that the OS layer 316 is disposed correspondingly to the bottom gate electrode 340. Preferably, a projection of the bottom gate electrode 340 along a vertical direction of the substrate 300 is disposed at a center of the OS layer 316, as shown in FIG. 7.

Figure 8:
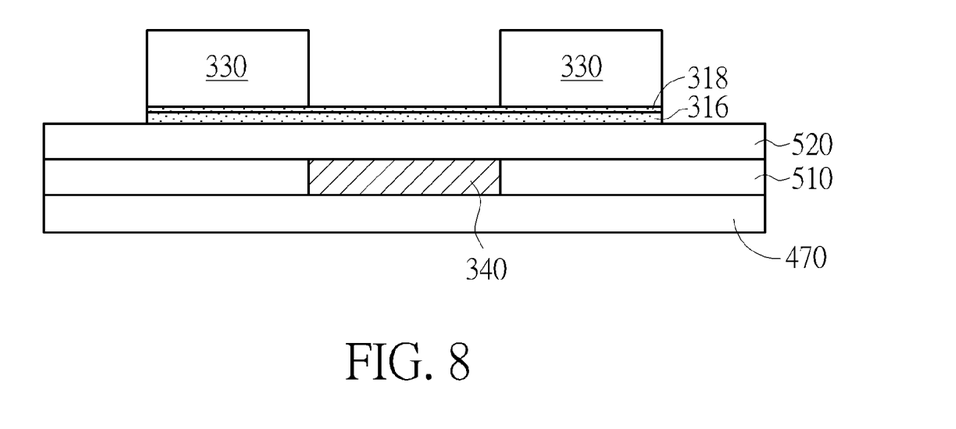

Then, the patterned conductive layer 320 is patterned again by using the insulating layer 318 and the OS layer 316 as etch stop layers, to form two separate parts, preferably two source/drain structures (S/D region) 330 with the same width, wherein a part of the OS layer 316 or the insulating layer 318 is exposed by the two S/D regions 330 (FIG. 8 only illustrates the embodiment of exposing the insulating layer 318). On the other hand, as described above, the outer sidewalls of the S/D region 330 are vertically aligned with the sidewall of the OS layer 316 and the sidewalls of the insulating layer 318. Also, in one embodiment of the present invention, the patterning process may be carried out by one single PEP or a plurality of PEPs, but is not limited thereto.

Thereafter, a high-k dielectric layer 324 is formed comprehensively on the substrate 300 and the S/D regions 330, in which it may be one single layer or have a multi-layered structure. Preferably, the high-k dielectric layer may include metal oxide, preferably earth metal oxide, like hafnium oxide, hafnium silicon oxide, hafnium silicon oxynitride, aluminum oxide, lanthanum oxide or hafnium zirconium oxide for example, but is not limited thereto. After that, a dielectric material 326 and a gate material layer 328 are conformally formed on the substrate 300. In one embodiment, the dielectric material layer 326 preferably includes a low-dielectric material, such as $SiO_2$, or a high-k dielectric material; and the gate material layer 328 may include any conductive material, such as metal, like aluminum (Al), molybdenum (Mo), titanium (Ti), tantalum (Ta), cadmium (Cd), a nitride thereof, an oxide thereof, alloys thereof, or a combination thereof.

Figure 9:
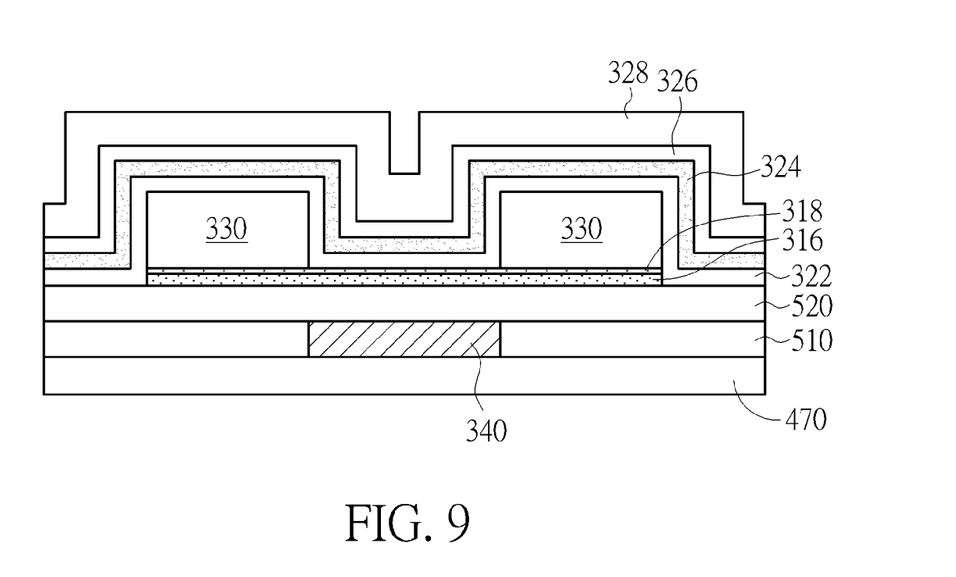

However, in one embodiment, after forming the high-k dielectric layer 324, an oxygen ambience treatment (not shown in the drawings) is performed on the high-k dielectric layer 324, wherein the oxygen ambience treatment may include an annealing process, a plasma treatment or a chemical solution process. With such oxygen ambience treatment, the oxygen atom in the high-k dielectric layer 324 may be released, and the high-k dielectric layer 324 can be tuned by the oxygen ambience treatment, so as to avoid the oxygen vacancy phenomenon. In another embodiment, another insulating layer 322 may be optionally formed, between the source/drain structures 330 and the high-k dielectric layer 324, as shown in FIG. 9. The insulating layer 322 is preferably composed of an oxide semiconductor (OS) material, such as InGaZnO, $InGaO_2$, $InZnO_2$ or ZnInO or GaZnO, and is not limited thereto. Preferably, the material of the OS material in the insulating layer 322 is different than that of the OS layer 316, and a thickness of the insulating layer 322 is less than that of the OS layer 316, but is not limited thereto. By doing this, the insulating layer 322 may directly contact the source/drain structures 330 and the exposed insulating layer 318 to serve as a barrier layer, for protecting the patterned sidewalls of the source/drain structures (also known as S/D regions) 330 and the exposed insulating layer 318. Also, in the embodiments without the insulating layer 318, the insulating layer 322 may directly contact the S/D regions 330 and the exposed OS layer 316.

Figure 10:
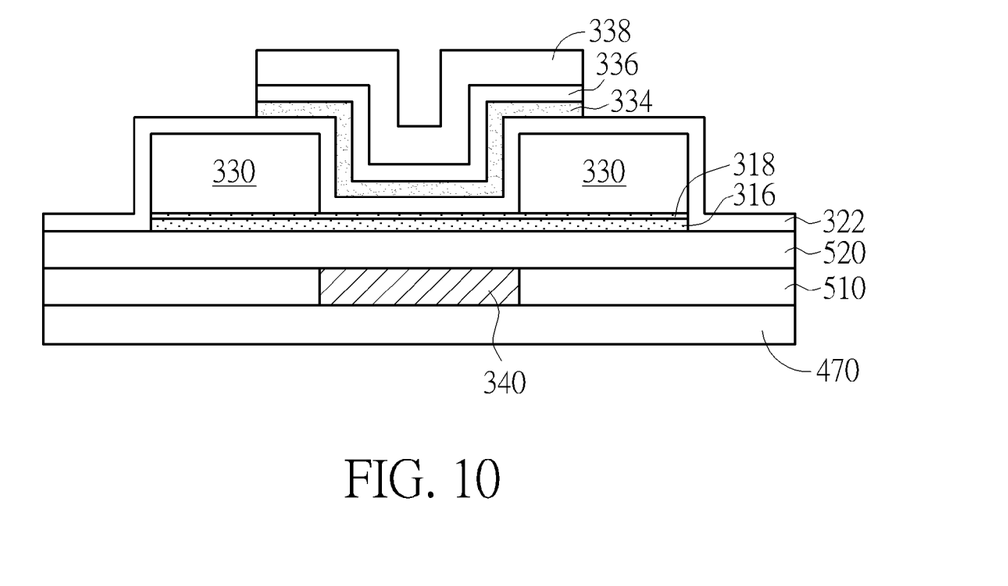

Following these, the gate material layer 328, the dielectric material layer 326 and the high-k dielectric layer 324 are patterned simultaneously to form a top gate electrode 338, a gate dielectric layer 336 and a patterned high-k dielectric layer 334 respectively. It is noted that the sidewall of the top gate electrode layer 336, the sidewall of the gate dielectric layer and the sidewalls of the patterned high-k dielectric layer 334 are vertically aligned with each other. Also, in the embodiment of forming the insulating layer 322, the insulating layer 322 may be also patterned optionally, or may be used as an etch stop layer while the patterning process is performed, as shown in FIG. 10.

According to the above description, the semiconductor device according to the first embodiment of the present invention is provided. In the subsequent processes, a plug process may be optionally performed, to further format least one plug (not shown in the drawings) to electrically connect to the source/drain structures and/or the top gate electrode of the OS structure, but is not limited thereto. As shown in FIG. 10, the semiconductor device of the present invention includes the substrate, the plugs and the damascene structures disposed in the first region of the substrate, and the OS structure disposed in the second region of the substrate. It is noted that, the hydrogen blocking layer is disposed only on sidewalls of the plugs and the damascene structures, wherein the hydrogen blocking layer includes a high dielectric constant (high-k) material, such as a metal oxide layer, preferably an earth metal oxide layer, like hafnium oxide, hafnium silicon oxide, hafnium silicon oxynitride, aluminum oxide, lanthanum oxide or hafnium zirconium oxide, but is not limited thereto. In other words, the hydrogen blocking layer laterally surrounds the plugs and the damascene structures between the transistor and the OS structure, so that, the hydrogen blocking layer is sufficient to prevent out-diffusion mist and hydrogen diffusing in the device, thereby avoiding such out-diffusion mist and hydrogen diffusing along the plug and affecting the OS structure or the subsequent forming processes.

People skilled in the art shall easily realize that the semiconductor device of the present invention is not limited to being formed through the aforementioned steps, and may include other forming methods. Thus, the following description will detail other different embodiments or variant embodiments of the manufacturing method of the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 11:
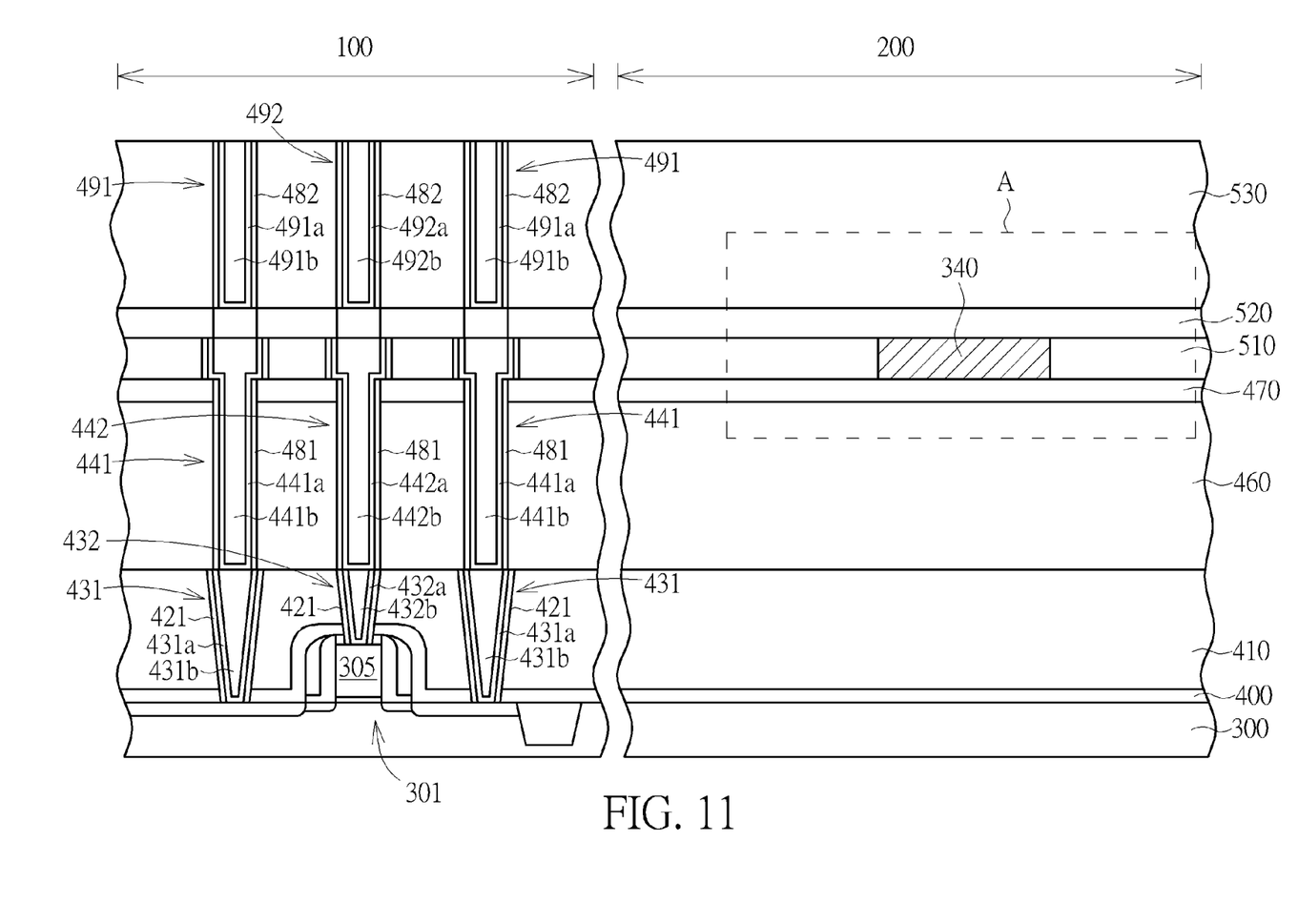
FIG. 11 is a schematic diagram illustrating a method of forming a semiconductor device according to a second embodiment of the present invention.

Please refer to FIG. 11, which is a schematic diagram illustrating a method of forming a semiconductor device according to the second embodiment of the present invention. The formal steps in the present embodiment are substantially similar to FIGS. 1-10 shown in the aforementioned first embodiment, including sequentially forming the substrate 300, at least one transistor 301, the plugs 431, 432 disposed in the first region 100 of the substrate 300 and the OS structure disposed in the second region 200 of the substrate 300. The differences between the present embodiment and the aforementioned first embodiment are that, after forming the structure shown in FIG. 5, a dielectric layer 530 may be formed additionally, and plugs 491, 492 or other damascene structures (not shown in the drawings), may be formed in the dielectric layer 530, to electrically connect the damascene structures 441, 442, as shown in FIG. 11.

Precisely, the plugs 491, 492 are laterally surrounded by a hydrogen blocking layer 482, and include barrier layers 491a, 492a, such as Ti/TiN and metal layers 491b, 492b, such as copper, respectively. It is noted that, the forming process of the hydrogen blocking layer 481 may be substantially similar to those of the hydrogen blocking layer 421, and the hydrogen blocking layer 482 may include a high-k dielectric material, such as a metal oxide layer, preferably an earth metal oxide layer, like hafnium oxide, hafnium silicon oxide, hafnium silicon oxynitride, aluminum oxide, lanthanum oxide or hafnium zirconium oxide, but is not limited thereto. Also, in order to avoid any interference to the subsequent processes or subsequent-formed components, like a plug forming process for example, caused by such hydrogen blocking layer 482, the hydrogen blocking layer 482 preferably includes a relative small thickness, substantially being between 10 angstroms (Å) to 15 angstroms, but is not limited thereto. Besides, the forming processes and the detailed materials of the plugs 491, 492 are substantially similar to those of the plugs 431, 432 in the aforementioned first embodiment or are well known in the art, and will not be redundantly described herein.

According to the above description, the semiconductor device according to the second embodiment of the present invention is provided. It is noted that, the hydrogen blocking layer in the present embodiment may also be formed to surround the plug structure disposed over the OS structure, such that, the mist and hydrogen diffused in the device may be further sufficiently blocked, so as to avoid such out-diffusion mist and hydrogen flowing along the plug structures and affecting the oxide semiconductor device in the subsequent forming processes.

In summary, the semiconductor device and the forming method thereof in the present invention include disposing the hydrogen blocking layers (including hafnium oxide, hafnium silicon oxide, hafnium silicon oxynitride, aluminum oxide, lanthanum oxide or hafnium zirconium oxide) on the sidewalls of the plugs either below or over an oxide semiconductor (OS) structure. Thus, the hydrogen blocking layer is sufficient to prevent out-diffusion mist and hydrogen diffusing in the device, so as to avoid such out-diffusion mist and hydrogen diffusing along the plug and affecting the OS structure or the subsequent forming processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a metal oxide semiconductor (MOS) transistor disposed on the substrate;
   a plug disposed on the MOS transistor to electrically connect thereto;
   a hydrogen blocking layer disposed only on sidewalls of the plug, wherein the hydrogen blocking layer comprises a high-k dielectric material; and
   an oxide semiconductor (OS) structure disposed on the substrate, wherein the OS structure comprises an oxide semiconductor layer, two source/drain structures disposed on the oxide semiconductor layer, a first gate electrode disposed between the source/drain structures on the oxide semiconductor layer, and a second gate disposed below the oxide semiconductor layer, wherein the first gate electrode and the second gate electrode both overlap the oxide semiconductor layer.

2. The semiconductor device according to claim 1, wherein the OS structure is disposed on the plug.

3. The semiconductor device according to claim 1, wherein the OS structure is disposed below the plug.

4. The semiconductor device according to claim 1, wherein the MOS transistor comprises a source/drain region, and the plug contacts the source/drain region.

5. The semiconductor device according to claim 1, further comprising:
   another plug disposed on the MOS transistor, wherein the another plug contacts a gate electrode of the MOS transistor; and
   another hydrogen blocking layer, disposed only on sidewalls on the another plug.

6. The semiconductor device according to claim 1, wherein the MOS transistor comprises a gate electrode, and the plug contacts the gate electrode.

7. The semiconductor device according to claim 1, wherein the hydrogen blocking layer has a thickness being about 10 angstroms to 15 angstroms.

8. The semiconductor device according to claim 1, wherein the oxide semiconductor layer comprises a monolayer structure or a multilayer structure.

9. The semiconductor device according to claim 1, wherein the high-k dielectric material comprises hafnium oxide, hafnium silicon oxide, hafnium silicon oxynitride, aluminum oxide, lanthanum oxide or hafnium zirconium oxide.

10. A method of forming a semiconductor device, comprising:
    providing a substrate;
    forming a metal-oxide-semiconductor (MOS) transistor on the substrate;
    forming a plug on the MOS transistor to electrically connect thereto;
    forming a hydrogen blocking layer disposed only on sidewalls of the plug, wherein the hydrogen blocking layer comprises a high-k dielectric material; and
    forming an oxide semiconductor (OS) structure on the substrate, wherein the OS structure comprises an oxide semiconductor layer, two source/drain structures disposed on the oxide semiconductor layer, a first gate electrode disposed between the source/drain structures on the oxide semiconductor layer, and a second gate disposed below the oxide semiconductor layer, wherein the first gate electrode and the second gate electrode both overlap the oxide semiconductor layer.

11. The method of forming the semiconductor device according to claim 10, wherein the OS stricture is formed after the plug is formed.

12. The method of forming the semiconductor device according to claim 10, wherein the OS structure is formed before the plug is formed.

13. The method of forming the semiconductor device according to claim 10, wherein the forming of the plug comprises:
    forming an opening in a dielectric layer on the substrate; and
    forming the plug filled in the opening.

14. The method of forming the semiconductor device according to claim 13, wherein the forming of the hydrogen blocking layer comprises:
    forming a material layer covering sidewalls and bottom walls of the opening before forming the plug filled in the opening; and
    removing the material layer on the bottom walls of the opening.

15. The method of forming the semiconductor device according to claim 10, wherein the plug contacts a source/drain region of the MOS transistor.

16. The method of forming the semiconductor device according to claim 15, further comprising:
    forming another plug on the MOS transistor to electrically connect thereto, wherein the another plug contacts a gate electrode of the MOS transistor; and
    forming another hydrogen blocking layer, only on sidewalls on the another plug.

17. The method of forming the semiconductor device according to claim 16, wherein the two plugs are formed simultaneously.

18. The method of forming the semiconductor device according to claim 10, wherein the high-k dielectric material comprises hafnium oxide, hafnium silicon oxide, hafnium silicon oxynitride, aluminum oxide, lanthanum oxide or hafnium zirconium oxide.

* * * * *